(12) United States Patent
Oohata

(10) Patent No.: US 6,963,086 B2
(45) Date of Patent: Nov. 8, 2005

(54) SEMICONDUCTOR LIGHT-EMITTING DEVICE IMAGE DISPLAY ILLUMINATOR AND ITS MANUFACTURING METHOD

(75) Inventor: Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/450,096

(22) PCT Filed: Oct. 10, 2001

(86) PCT No.: PCT/JP02/09898

§ 371 (c)(1),
(2), (4) Date: Sep. 25, 2003

(87) PCT Pub. No.: WO03/034509

PCT Pub. Date: Apr. 24, 2003

(65) Prior Publication Data

US 2004/0051110 A1 Mar. 18, 2004

(30) Foreign Application Priority Data

Oct. 10, 2001 (JP) ........................................ 2001-312207

(51) Int. Cl.$^7$ ...................... H01L 33/00; H01L 27/15; H01L 31/12; H01L 31/153
(52) U.S. Cl. .............................. 257/99; 257/85; 257/91; 257/98
(58) Field of Search ...................... 257/79–103; 438/22, 438/25–29, 341, 481

(56) References Cited

U.S. PATENT DOCUMENTS 5,981,977 A * 11/1999 Furukawa et al. ............ 257/94
6,320,209 B1 * 11/2001 Hata et al. .................... 257/190
6,325,850 B1 * 12/2001 Beaumont et al. ............ 117/95

FOREIGN PATENT DOCUMENTS

EP       0545262 A1    6/1993
GB       2326023 A     12/1998
JP       5-8958        2/1993
JP       5-41536 A     2/1993

(Continued)

OTHER PUBLICATIONS

Yang, et al., "Single–crystal GaN pyramids grown on (111) Si substrates by selective lateral overgrowth", Journal of Crystal Growth 204 (1999), pp. 270–274.

(Continued)

Primary Examiner—Shouxiang Hu
(74) Attorney, Agent, or Firm—Wolf, Greenfield & Sacks, P.C.

(57) ABSTRACT

Disclosed are a semiconductor light emitting device capable of enhancing a light emergence efficiency at a lower light emergence plane of the device by forming an electrode on a halfway area of a tilt crystal plane and a fabrication method thereof. According to this light emitting device, since light emitted by a light emitting region can be efficiently, totally reflected and a current can be injected only in a good crystalline region for the reason that the halfway area, on which the electrode is formed, of the tilt crystal plane is better in crystallinity than other regions of the tilt crystal plane, it is possible to enhance both a light emergence efficiency and a luminous efficiency, and hence to enhance the light emergence efficiency by an input current.

According to an image display system and an illuminating system, each of which includes an array of the semiconductor light emitting devices of the present invention, and fabrication methods thereof, since the light emitting devices each of which is capable of exhibiting a high luminous efficiency by an input current are arrayed on a substrate on the system, it is possible to provide an image display system capable of reducing a density of a current to each device and displaying a high quality image, and an illuminating system capable of ensuring high brightness.

25 Claims, 7 Drawing Sheets

FOREIGN PATENT DOCUMENTS

| | | |
|---|---|---|
| JP | 6-21508 A | 1/1994 |
| JP | 6-188450 A | 7/1994 |
| JP | 7-38149 A | 2/1995 |
| JP | 7-58359 A | 3/1995 |
| JP | 08-102551 | 4/1996 |
| JP | 09-092881 | 4/1997 |
| JP | 9-129974 A | 5/1997 |
| JP | 09-162444 | 6/1997 |
| JP | 09-199419 | 7/1997 |
| JP | 10-256151 | 9/1998 |
| JP | 10-265297 | 10/1998 |
| JP | 10-270801 | 10/1998 |
| JP | 10-312971 | 11/1998 |
| JP | 11-238687 | 8/1999 |
| JP | 2000-012976 | 1/2000 |
| JP | 2000-150391 | 5/2000 |
| JP | 2001-68743 A | 3/2001 |
| JP | 2001-85738 A | 3/2001 |

OTHER PUBLICATIONS

Singh, et al., "Selective Area Growth of GaN Directly on (0001) Sapphire by the HVPE Technique", MRS Internet Journal Nitride Semiconductor Research 3, 13 (1998) pp. 1–4.

Wang, et al., "Fabrication of nanoscale structures of InGaN by MOCVD lateral overgrowth", Journal of Crystal Growth, 197 (1999), pp. 48–53.

Mao, et al., "Defects in GaN Pyramids Grown on Si(111) Substrates by Selective Lateral Overgrowth", Dept. of Chem. Eng. and Materials Science, Univ. of Minn., pp. 1–6.

Kapolnek, et al., "Spatial control of InGaN luminescence by MOCVD selective epitaxy", Journal of Crystal Growth, 189/190 (1998), pp. 83–86.

Someya et al., "Gallium–nitride–based lasers in the next generation–Blue surface emitting lasers and blue quantum dot lasers", Oyo Buturi, vol. 69, No. 10, pp. 1196–1199 (2000).

* cited by examiner

SEMICONDUCTOR LIGHT-EMITTING DEVICE IMAGE DISPLAY ILLUMINATOR AND ITS MANUFACTURING METHOD

TECHNICAL FIELD

The present invention relates to a semiconductor light emitting device having a double-hetero structure that crystal layers composed of a first conductive type layer, an active layer, and a second conductive type layer are formed on a crystal growth layer, wherein the crystal layers have tilt crystal planes tilted from the principal plane of a substrate. In particular, the present invention relates to a semiconductor light emitting device having a high light luminous efficiency and a fabrication method thereof, and an image display system and an illuminating system, each of which includes an array of the semiconductor light emitting devices, and fabrication methods thereof.

BACKGROUND ART

Semiconductor light emitting devices have been known, which are fabricated by stacking, on the entire surface of a sapphire substrate, an n-side contact layer made from GaN doped with Si, an n-side cladding layer made from GaN doped with Si, an active layer made from InGaN doped with Si, a p-side cladding layer made from AlGaN doped with Mg, and a p-side contact layer made from GaN doped with Mg. These devices having such a structure have been commercially available as industrialized blue and green LEDs (Light Emitting Diodes) for emission of light in a range of 450 nm to 530 nm.

Various methods have been proposed to increase brightness of semiconductor light emitting devices. These methods are mainly classified into a method of improving a luminous efficiency on the basis of a current inputted in the device and a method of improving a light emergence efficiency by allowing emitted light to efficiently emerge out of the device. The former improvement of the luminous efficiency is dependent on a material forming a crystal layer, a crystal structure, a crystal growing ability, a combination of crystal layers, and a fabrication process. With respect to the latter improvement of the light emergence efficiency, it is required to examine reflection of light depending on a device structure and an array structure of the devices mounted on a system device, and it is important to allow emitted light to emerge out of the device without damping and leakage.

With respect to the method of improving the light emergence efficiency on the basis of an input current, particularly, in a device having a tilt crystal plane tilted from the principal plane of a substrate, a light emitting region composed of a first conductive type layer, an active layer, and a second conductive type layer can be formed on the whole or part of the S-plane. In the case where the device is formed into an approximately hexagonal truncated shape, a first conductive type layer, an active layer, and a second conductive type layer can be formed even on the upper surface parallel to the principal plane of a substrate. In the case of a semiconductor light emitting device formed into a flat shape having a plane parallel to the principal plane of a substrate, light is damped by multi-reflection. On the contrary, in the case of the semiconductor light emitting device having the S-plane, since light emission is performed by making use of the S-plane, light is allowed to emerge out of the device from the light emergence plane without the effect of multi-reflection. The crystal layer having the S-plane may be configured such that part of the crystal plane forming the S-plane function as the first conductive type layer. Further, the crystal layer having a crystal plane not perpendicular to the principal plane of a substrate is effective to improve the light emergence efficiency.

In a semiconductor light emitting device having a tilt crystal plane, the luminous efficiency can be enhanced by making use of good crystallinity of the tilt crystal plane. In particular, in the case of injecting a current only in the S-plane having good crystallinity, since the S-plane exhibits good incorporation of In and good crystallinity, the luminous efficiency can be enhanced. In addition, the area of the active layer extending within a plane substantially parallel to the S-plane can be made larger than the area of the active layer projected on a substrate or the principal plane of an underlying growth layer. With this configuration, since the area of the light emission area becomes substantially large, it is possible to reduce a current density, and to reduce saturated brightness and hence to increase the luminous efficiency.

By the way, in the above-described semiconductor light emitting device having the tilt crystal plane tilted from the principal plane of a substrate, if the device has a hexagonal pyramid shaped crystal layer, the state of steps of a portion, neat the vertex, of the S-plane becomes poor, with a result that the luminous efficiency of the vertex portion is degraded. The reason for this is as follows: namely, assuming that a plane of the hexagonal pyramid shape is divided into a vertex side area, a left side area, a right side area, and a bottom side area by two lines passing through with respect to an approximately center portion of the plane, the state of steps on the vertex side area is particularly wavy, with a result that abnormal growth of crystal is liable to occur in the vertex side area. On the contrary, in each of the right and left side areas, steps densely extend in the forms of approximately straight lines, with a result that crystal is very desirably grown, and in the bottom side area, steps are slightly wavy, with a result that the crystal growth state is poorer than that in each of the right and left side areas.

If a p-side electrode is formed in a region, in which the state of steps is undesirable, of the tilt crystal plane, the luminous efficiency on the basis of an input current becomes lower than that of the case where the p-side electrode is formed in a region in which the state of steps is desirable. Accordingly, it is desirable to form an electrode in a region other than an area in the vicinity of the vertex portion in which the state of steps is wavy and an area in the vicinity of the bottom surface in which the state of steps is slightly wavy.

On the other hand, in the case of forming an electrode on a tilt crystal plane, since the electrode is tilted relative to a light emergence plane of the device, it is possible to suppress multi-reflection of emitted light and hence to suppress damping of light, and to allow light reflected from the electrode to emerge out of the light emergence plane provided on the bottom surface of the device.

However, if an electrode is not formed in the areas, in the vicinities of the vertex and the bottom surface of the device, of the tilt crystal plane, the ratio of a light component not reflected from the electrode in the light emergence direction to light emitted by a light emitting region becomes high.

Further, of the light reflected from the electrode formed on the tilt crystal plane, a light component having a large incident angle relative to the light emergence plane is totally reflected from the light emergence plane and thereby is not allowed to emerge out of the device. As a result, even if an electrode is formed only in a good crystalline region to improve the luminous efficiency, it is impossible to enhance the light emergence efficiency and hence to sufficiently obtain the effect of forming the light emitting region only in a good crystalline area.

In view of the foregoing, the present invention has been made, and an object of the present invention is to provide a semiconductor light emitting device capable of enhancing the luminous efficiency while increasing the light emergence efficiency, and a fabrication method thereof, and to provide an image display system and an illuminating system, each of which includes an array of the semiconductor light emitting devices, and fabrication methods thereof.

DISCLOSURE OF INVENTION

According to a semiconductor light emitting device in which an electrode is formed in a halfway area of a tilt crystal plane and a fabrication method thereof according to the present invention, the electrode formed in the halfway area of the tilt crystal plane is located at such a position as to allow light emitted from a crystal layer to which a current is injected by the electrode to be efficiently, totally reflected from the surface of a portion, provided with no electrode, of the tilt crystal plane. As a result, it is possible to enhance the light emergence efficiency from a light emergence plane on the lower side of the device. Further, since the emitted light can be efficiently, totally reflected as described above and the halfway area, on which the electrode is formed, of the tilt crystal plane is better in crystallinity than other regions of the tilt crystal plane, it is possible to inject a current only in the good crystalline region, and hence to enhance the luminous efficiency. By enhancing both the light emergence efficiency and the luminous efficiency, it is possible to form a semiconductor light emitting device exhibiting a high emergence efficiency on the basis of an input current.

According to an image display system and an illuminating system, each of which includes an array of semiconductor light emitting devices according to the present invention, since light emitting devices each of which exhibits a high light emergence efficiency on the basis of an input current are arrayed on a system substrate, it is possible to provide an image display device capable of reducing the density of a current to each device and displaying a high quality image, and to provide an illuminating system capable of ensuring high brightness. In particular, the image display system and illuminating system, each of which includes the array of a large number of light emitting devices, have a large effect of reducing power consumption.

BEST MODE FOR CARRYING OUT THE INVENTION

Figure 1:
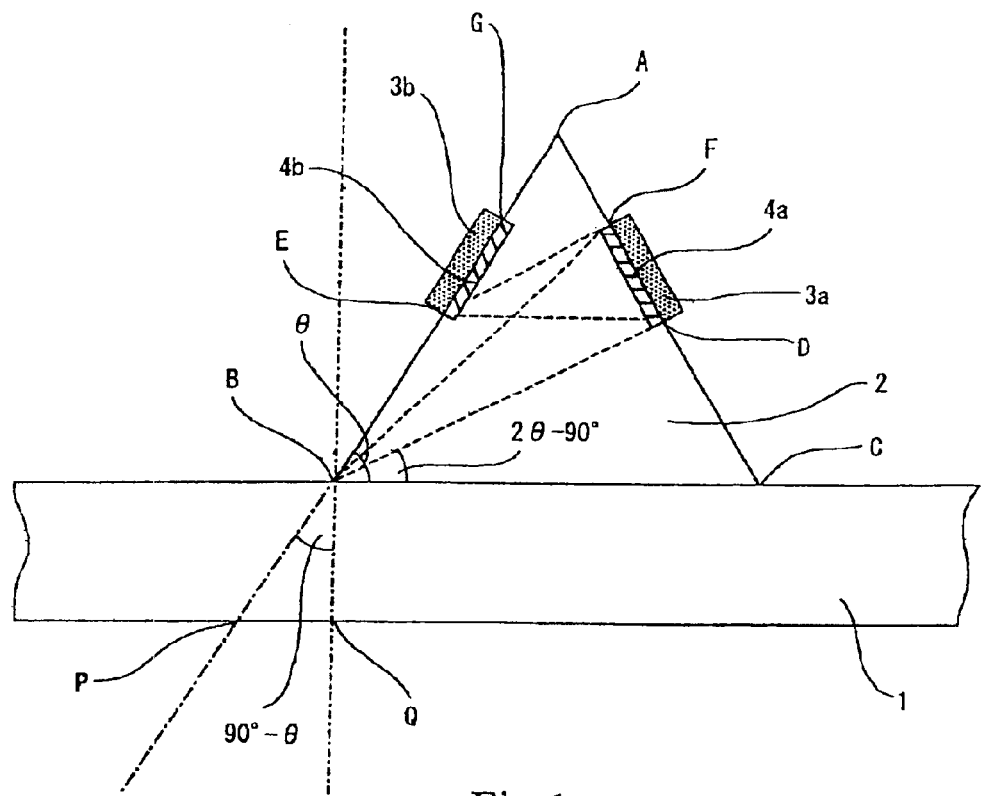
FIG. 1 is a schematic sectional view schematically showing the structure of a semiconductor light emitting device according to an embodiment of the present invention.

In this embodiment, the structure of a tilt crystal layer tilted from the principal plane of a substrate according to the present invention will be described, and then a formation position of an electrode to be formed on a tilt crystal plane will be described. After that, an electrode structure will be described, and then an image display system and an illuminating system, each of which includes semiconductor light emitting devices each having an electrode formed in a halfway area of the tilt crystal plane according to the present invention and fabrication methods thereof, will be descried.

A substrate used for growing a crystal layer according to the present invention may be made from any material without departing from the scope of the present invention. In particular, in the case of forming a crystal layer having a tilt crystal plane tiled from the principal plane of a substrate, the substrate may be made from a material selected from sapphire ($Al_2O_3$, containing the A-plane, R-plane, and C-plane), SiC (containing 6H, 4H, and 3C), GaN, Si, ZnS, ZnO, AlN, LiMgO, GaAs, $MgAl_2O_4$, InAlGaN, and the like. Preferably, the above material has a hexagonal crystal system or a cubic system, and more preferably, it has the hexaganal system. For example, in the case of using a sapphire substrate, the C-plane of sapphire, which has been often used for growing gallium nitride (GaN) based compound semiconductors, is used as the principal plane of the substrate. The C-plane used herein may contain a plane tilted from the strict C-plane by an angle of 5 to 6°. The substrate is not contained in a light emitting device as a product. That is to say, the substrate is used for holding a device portion during fabrication process, and is removed before the device is accomplished. The material of the substrate is not limited to sapphire but may be a material having light permeability, such as gallium nitride, glass, or a transparent resin. A substrate on which a device is to be formed by crystal growth may be separated from a substrate to which the device is to be mounted by transfer or the like.

Before a tilt crystal layer tilted from the principal plane of a substrate is formed, an underlying growth layer may be formed on the substrate. The underlying growth layer may be made from gallium nitride or aluminum nitride. Alternatively, the underlying growth layer may be a combination of a low temperature crystal growth layer and a high temperature crystal growth layer or a combination of a crystal growth layer and a crystal seed layer functioning as a crystal seed.

The crystal layer having a tilt crystal plane tilted from the principal plane of a substrate is not particularly limited insofar as a light emitting region composed of a first conductive type layer, an active layer, and a second conductive type layer can be formed thereon. Preferably, the crystal layer has a wurtzite crystal structure. Examples of the material suitable for the crystal layer include a group III based compound semiconductor, a BeMgZnCdS based compound semiconductor, and BeMgZnCdO based compound semiconductor, and further, an indium nitride (InN) based compound semiconductor, an indium gallium nitride (InGaN) based compound semiconductor, and aluminum gallium nitride (AlGaN) based compound semiconductor. In particular, a nitride semiconductor such as a gallium nitride based compound semiconductor is preferably used as the material for the crystal layer. A tilt crystal plane of the crystal layer contains a plane tilted from the S-plane or the (11–22) plane by an angle of 5 to 6°.

The first conductive type layer is a p-type or n-type cladding layer, and the second conductive type layer is the opposed conductive type cladding layer. In the case where the crystal layer having the S-plane is made from a silicon-doped gallium nitride based compound semiconductor layer, a silicon-doped gallium nitride based compound semiconductor layer may be formed as the n-type cladding layer, an InGaN layer be formed thereon as the active layer, and a magnesium-doped gallium nitride based compound semiconductor layer be formed thereon as the p-type cladding layer, to form a double-hetero structure. The active layer may have a structure that the InGaN layer is sandwiched between AlGaN layers. The active layer can be formed as a single bulk active layer, but may be formed as a quantum well structure such as a single quantum well (SQW) structure, a double quantum well (DQW), or a multi-quantum well (MQW) structure. The quantum well structure may include a barrier layer for separating quantum wells as needed. The active layer made from InGaN is advantageous in easy fabrication and improvement of light emitting characteristics of the device. Further, in the case of forming the InGaN layer on the S-plane from which nitrogen atoms are less desorbed, the InGaN layer is easy to grow on the S-plane, and is capable of improving the crystallinity, thereby enhancing the luminous efficiency.

In the case of selective crystal growth, if any crystal seed layer is not provided, the crystal layer must be formed from the crystal growth layer, and if the crystal layer is formed from the crystal growth layer by selective growth, crystal tends to grow on a portion at which the crystal growth is inhibited. For this reason, the crystal seed layer may be used for growth of crystal with good selectivity.

The selective growth method will be concretely described below. The selective growth is performed by making use of selective removal of part of an underlying growth layer, or making use of an opening portion selectively formed on an underlying growth layer or before formation of the underlying growth layer. For example, if the underlying growth layer is composed of a crystal growth layer and a crystal seed layer, the crystal seed layer on the crystal growth layer may be divided into fine regions each having a diameter of about 10 μm, and then a crystal layer having the S-plane or the like may be formed by crystal growth from the fine regions. For example, the fine regions divided from the crystal seed layer may be arrayed so as to be spaced from each other at intervals as margins for separating a device structure into individual light emitting devices. Such a fine region may be formed into a shape selected from a circular shape, a square shape, a hexagonal shape, a triangular shape, a rectangular shape, a diamond-like shape, and other shapes modified therefrom. The selective growth can be performed by forming a mask layer on the underlying growth layer, and selectively forming an opening as a window region in the mask layer. The mask layer may be made from silicon oxide or silicon nitride. In the case of forming the crystal layer having an approximately hexagonal truncated pyramid or approximately hexagonal pyramid shape extending in straight line along the longitudinal direction, a stripe shaped window region may be formed in the mask layer.

In the case of selectively growing the crystal layer only over an opening portion formed in a selective growth mask, since there is no lateral growth, crystal may be laterally grown into a shape enlarged from the opening portion (the window region) by a micro-channel epitaxy process. It is known that the lateral growth by using the micro-channel epitaxy process is advantageous in avoiding threading dislocations, thereby reducing the density of the dislocations. The lateral growth is also advantageous in enlarging a light emitting region, equalizing a current, avoiding the concentration of a current, and reducing a current density.

The crystal layer having a tilt crystal plane tilted from the principal plane of a substrate may be formed into an approximately hexagonal pyramid shape having, on the tilt planes, the S-planes or planes substantially equivalent thereto, or formed into an approximately hexagonal truncated pyramid shape having, on the tilt planes, the S-planes or planes substantially equivalent thereto and also having, on the upper end portion, the C-plane or a plane substantially equivalent thereto. Such an approximately hexagonal pyramid or approximately hexagonal truncated pyramid shape is not limited to the strict hexagonal pyramid or hexagonal truncated pyramid shape, but may miss one or more planes thereof. As a preferable example, the crystal layer has tilt crystal planes which are approximately symmetrically disposed. The approximately symmetrical shape contains the perfectly symmetrical shape and a shape somewhat offset from the perfect symmetrical shape. The ridge line between adjacent two of crystal planes of the crystal layer is not necessarily a straight line. Further, the above-described approximately hexagonal pyramid or approximately hexagonal truncated pyramid shape may extend in straight line.

These first conductive type layer, the active layer, and the second conductive type layer extend within planes parallel to the tilt crystal planes tilted from the principal plane of a substrate. The formation of these layers such that they extend the planes parallel to the principal plane of the substrate may be easily realized by continuing crystal growth for these layers immediately after the formation of the tilt crystal planes. In the case of forming the crystal layer having an approximately hexagonal pyramid or approximately hexagonal truncated pyramid shape which has the S-planes as the tilt crystal planes, the light emitting region composed of the first conductive type layer, the active layer, and the second conductive type layer can be formed on the whole of part of the S-planes. In the case of an approximately hexagonal truncated pyramid shape, the first conductive type layer, the active layer, and the second conductive type layer can be formed even on the upper plane parallel to the principal plane of a substrate. In the case of the crystal layer having a flat shape parallel to the principal plane of a substrate, light is damped by multi-reflection. On the contrary, the crystal layer configured such that light emission is performed by using the tilt S-planes is advantageous in that light merges out of the semiconductor device without any effect of multi-reflection because of the presence of the tilt planes. Accordingly, the crystal layer having crystal planes not perpendicular to a substrate is able to improve the light emergence efficiency. The first conductive type layer, that is, the cladding layer can be made from the same material as that of the crystal layer having the S-planes so as to have the same conductive type as that of the crystal layer, and therefore, it can be easily formed by adjusting, after formation of the crystal layer having the S-planes, the concentration of the source gas. Alternatively, part of the crystal layer having the S-plane may be made to function as the first conductive type layer.

In the above-described semiconductor light emitting device, the luminous efficiency can be enhanced by making use of good crystallinity of the tilt crystal planes. In particular, in the case of injecting a current only in the S-plane having good crystallinity, since the S-plane exhibits good incorporation of In and good crystallinity, the luminous efficiency can be enhanced. In addition, the area of the active layer extending within a plane substantially parallel to the S-plane can be made larger than the area of the active layer projected on a substrate or the principal plane of an underlying growth layer. With this configuration, since the light emission area becomes large, it is possible to reduce a current density, and to reduce saturated brightness and hence to increase the luminous efficiency.

According to the present invention, it is intended to provide an electrode forming a light emitting region in a good crystalline area of an approximately hexagonal pyramid shape formed by selective growth, and to efficiently reflect light emitted by the light emitting region from the electrode and a portion, provided with no electrode, of the tilt crystal plane and lead the reflected light to a light emergence plane. The formation position of such an electrode will be first described.

FIG. 1 is a schematic sectional view showing the structure of an approximately hexagonal pyramid shaped semiconductor light emitting device formed by selective growth from an opening portion (not shown) formed in a crystal growth substrate. A point A is the vertex of the device, and FIG. 1 shows the cross-sectional view of the device taken on a plane which is perpendicular to the bottom surface of the device and which contains the point A. The device is fabricated by forming a crystal growth layer 1 on the substrate and a tilt crystal layer 2 on the crystal growth layer 1. The tilt crystal layer 2 has a multi-layer structure of a first conductive type layer having tilt crystal planes tilted from the principal plane of the substrate, an active layer formed on the tilt crystal layer, and a second conductive type layer formed on the active layer, wherein electrodes 3a and 3b are formed on halfway areas of the second conductive type layer. Light emitted from a light emitting region of the active layer emerges out of the device. At this time, the bottom surface of the hexagonal pyramid shaped semiconductor light emitting device is taken as a light emergence surface. It is to be noted that the multi-layer structure of the second conductive type layer, the active layer, and the second conductive type layer is not shown in the figure. In the figure, there are shown the crystal growth layer 1 for growing the tilt crystal layer, a bottom side BC contained in the bottom surface, light emitting regions 4a and 4b, the outermost tilt crystal planes, and the electrodes 3a and 3b formed on the halfway areas of the outermost tilt crystal planes. The light emitting regions 4a and 4b are defined as regions, on which the electrodes 3a and 3b are projected, of the active layer extending in parallel to the tilt crystal planes. A current is substantially injected from the electrodes 3a and 3b in the light emitting regions 4a and 4b.

The formation positions of the electrodes 3a and 3b will be described with reference to FIG. 1. First, bottom ends of the bottom side of the approximately hexagonal pyramid portion of the device are taken as points B and C, and the vertex of the device is taken as a point A. The tilt crystal layer is grown in the height direction while being symmetrically spread in the lateral direction from the center of the side BC contained in the growth initiating plane of the tilt crystal layer. The lengths of the side AB and the side AC are nearly equal to each other, and the angle ABC and the angle ACB are equal to each other. Accordingly, the triangle ABC is an isosceles triangle having the angles ABC and ACB equal to each other. The angle ABC is here defined as θ. It is to be noted that the crystal growth layer 1 is formed on the substrate (not shown), and is made from the same material as that of the tilt crystal layer 2, which material is a GaN based material in this embodiment.

The side AB is extended from the point B, and an intersection at which the extended straight line from the side AB intersects the back surface of the crystal growth layer 1 is taken as a point P. An intersection at which a straight line extending in perpendicular to the front surface of the crystal growth layer 1 while passing through the point B intersects the back surface of the crystal growth layer 1 is taken as a point Q. The lower end of an electrode formed on the tilt crystal plane containing the side AC is taken as a point D. An intersection at which a straight line extending from the point D in the direction parallel to the side BC intersects the side AB is taken as a point E. An intersection at which a straight line extending from the point E in the direction parallel to the side BD intersects the side AC is taken as a point R. Based on these points thus defined, the electrode 3a having both ends located at the points D and F is formed on the tilt crystal plane containing the side AC, and similarly the electrode 3b having both the ends located at the points E and G is formed on the tilt crystal plane containing the side AB.

To achieve efficient emergence of light out of the device, it is required to enhance both the light emergence efficiency and the luminous efficiency of the device. That is to say, it is required to form an electrode on the tilt crystal plane at such a position as to obtain most efficient emergence of light out of the device from the viewpoints of both the above-described efficiencies. The conditions for enhancing both the light emergence efficiency and the luminous efficiency will be described below.

First, the condition for enhancing the light emergence efficiency in the case of forming an electrode on a halfway area of the tilt crystal plane will be described. To enhance the light emergence efficiency, it is required to reflect light emitted by the light emitting region from the electrode and the boundary between the tilt crystal plane and the outside and lead the light to the light emergence plane. FIG. 1 typically shows the device such that the outermost tilt crystal planes on which the electrodes 3a and 3b are formed correspond to the substantial light emitting regions 4a and 4b of the active layer. Hereinafter, description will be made by example of a light component, made directly incident on the light emergence plane, of light emitted from the light emitting region 4a (which light component is hereinafter referred to as "directly incident light component"), and a light component, reflected once from the electrode or the tilt crystal plane and made incident on the light emergence plane, of multi-reflected light (which light component is hereinafter referred to as "indirectly incident light component").

The directly incident light component directly travels from the light emitting region 4a of the active layer to the side BC, and is thereby not reflected from the electrode or the tilt crystal plane. In this embodiment, since the light emitting region 4a is tilted from the side BC, the area of the light emitting region can be made substantially larger than that of a light emitting region extending in parallel to the side BC, with a result that a larger amount of light is able to emerge out of the device.

First, of light emitted by the light emitting region 4a, a light component traveling to a portion of the tilt crystal plane, which portion is located on the side EB of the side AB opposed to the side AC, will be described. Since any electrode is not formed on the side EB, the light component, traveling to the side EB, of the light emitted by the light emitting region 4a is not reflected from the electrode. As a result, it is desirable that the light emitted by the light emitting region 4a is totally reflected from the portion, provided with no electrode, of the tilt crystal plane with little passing there through. At this time, of the light component, traveling to the side EB, of the light emitted by the light emitting region 4a, a light component part traveling to the point B at the largest angle relative to the side EB is that emitted from the vicinity of the point D of the light emitting region 4a at an angle DBE relative to the side EB. As a result, if the angle DBE of light emitted from the vicinity of the point D is a critical angle of light totally reflected from the side EB, the light component, traveling to the point B, of the light emitted by the light emitting region 4a is totally reflected from the point B.

By the way, according to this embodiment, the nearly whole portion of the crystal layer having the triangular shape ABC is substantially made from the same GaN based material as that of the crystal growth layer 1, and accordingly, the optical characteristics, such as a refractive index, of the crystal layer having the triangular shape ABC are nearly equal to those of the crystal growth layer 1. As a result, the light component traveling at the angle DBE relative to the side EB and entering the point B is totally reflected from the point B at an angle QBP relative to the side BP. Here, if light is totally reflected from the point B, the incident angle DBE of the light is equal to a reflection angle QBP ($\angle DBE = \angle QBP$) of the light. On the other hand, the vertical angle of the incident light is equal to that of the reflection light. Accordingly, a relationship of $\angle QBP = 90° - \theta$ is established. As a result, with respect to light emitted by the light emitting region 4a and totally reflected from the point B, a relationship of $\angle DBE = \angle QBP = 90° - \theta$ is established. Therefore, an angle DBC, which determines the position of the point D, that is, the lower end of the electrode 3a, is specified by a relationship of $\angle DBC = \angle ABC - \angle DBE = \theta - (90° - \theta) = 2\theta - 90°$.

Next, the condition under which a light component emitted from the vicinity of the point F, that is, the upper end of the electrode 3a in the light emitting region 4a is totally reflected from the side EB will be described. Of the light component emitted from the vicinity of the point F in the light emitting region 4a and traveling to the side EB, a light component part made incident on the side EB at the largest incident angle is that traveling to the point E. Accordingly, if an angle FEA is a critical angle of total reflection, the light component emitted from the vicinity of the point F in the light emitting region 4a and traveling to the side EB is totally reflected from the side EB, to travel to the light emergence plane. By the way, the side FE is parallel to the side DB and the angle DBE is the critical angle of light totally reflected from the portion, located on the side AB, of the tilt crystal plane, the angle DBE is equal to an angle FEG ($\angle DBE = \angle FEG$). As a result, the light component, traveling to the point E, of the light emitted from the vicinity of the point F in the light emitting region 4a is totally reflected from the point E, and is therefore, totally reflected from all the points on the side EB.

By setting both the ends of the electrode 3a at the points D and F, a light component, traveling to the side EB, of light emitted from the vicinity of each end of the light emitting region 4a is effectively, totally reflected from the side EB. Most of a light component, traveling to the side EB, of light emitted from a portion between both the ends of the light emitting region 4a is totally reflected from the side EB, to travel to the light emergence plane. A light component, traveling to the electrode 3b, of light emitted by the light emitting region 4a is reflected from the electrode 3b. To efficiently reflect light from the electrode 3b, it is required to examine a material capable of suppressing transmission of light, a film thickness, an electrode structure, and the like, as will be described in the embodiments.

In the structure that any light reflection film is not formed in a region containing the upper sides of the electrodes 3a and 3b and the vertex of the device as shown in FIG. 1, a certain proportion of light emitted by the light emitting region is leaked out through the region containing the vertex of the device, and the remaining portion of the light is lead to the light emergence plane. Accordingly, by forming a light reflection film on the region containing the vertex portion provided with no electrode, it is possible to suppress transmission of light and hence to increase the light emergence efficiency. The structure of such a light reflection film will be described in detail in the embodiments.

The condition required for enhancing the luminous efficiency will be described below. To enhance the luminous efficiency, it is desirable to form an electrode on a portion, other than a poor crystalline region in the vicinity of the vertex of the device and the vicinity of the bottom surface of the device, of the tilt crystal plane. To be more specific, it is desirable that an electrode is formed on a halfway area, having good crystalline, of the tilt crystal plane, wherein the lower end of the electrode is set to a point being shifted from the upper side of the tilt crystal plane as much as possible and the upper end of the electrode is set to a point being shifted to the lower side of the tilt crystal plane as much as possible. This is advantageous in that light emission can be realized by injecting a current only in a good crystalline region, to enhance the luminous efficiency. However, it is difficult to clearly separate the tilt crystal plane into a good crystalline halfway area, in which the electrode is to be formed, and a poor crystalline area in the vicinity of the vertex of the device and in the vicinity of the bottom surface of the device.

Part of light emitted by the light emitting region 4a composed of the active layer is not totally reflected from a portion, located on the side EB, of the tilt crystal plane, to pass there through. Such a light component, therefore, is not able to emerge out of the light emergence plane. However, it is possible to realize efficient emergence of light emitted by the light emitting region on the basis of a current inputted in the device by combining the effect of enhancing the luminous efficiency by forming the light emitting region only in a good crystalline area with the effect of allowing emergence of most of light emitted by the light emitting region from the light emergence plane.

To realize more efficient emergence of light, in addition to the configuration that the light emitting region is formed only in a good crystalline area, a current block layer having light permeability may be formed over a region containing the upper sides of the electrode and the vertex of the device and a metal thin film functioning as a light reflection film may be formed on the current block layer. With this configuration, light traveling to the vicinity of the vertex of the device is reflected from the reflection film toward the light emergence plane, to emerge out of the light emergence plane. The current block layer formed on a poor crystalline area may be combined with a metal thin film capable of efficiently reflecting light emitted by the light emitting region. With this configuration, it is also possible to realize efficient emergence of light out of the light emergence plane on the basis of a current inputted in the device.

Hereinafter, various structures of an electrode to be formed at the above-described electrode formation position will be sequentially described, and then an image display system and an illuminating system each including an array of semiconductor light emitting devices each having an electrode formed in a halfway area of a tilt crystal plane according to the present invention will be described.

It is to be noted that, for each of the following semiconductor light emitting devices, an electrode for injecting a current in a crystal layer is formed in a halfway area of a tilt crystal plane at an electrode position determined by the above-described angle ($2\theta$–$90°$).

[Embodiment 1]

Figure 2:
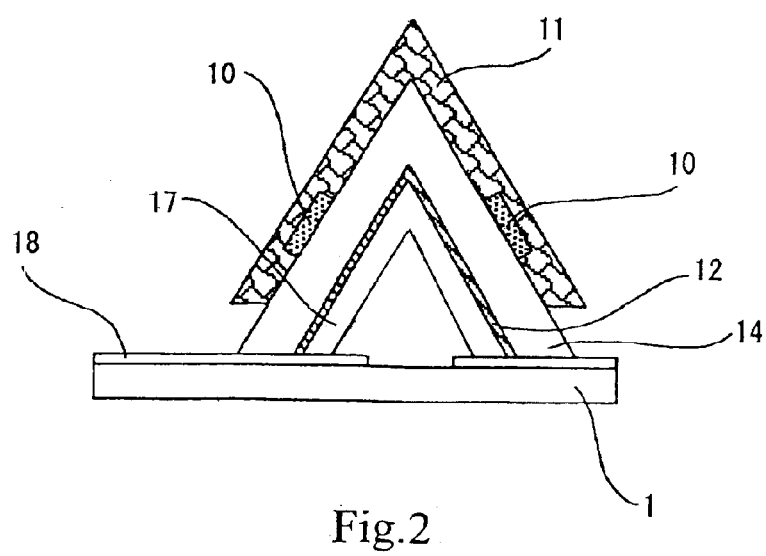
FIG. 2 is a sectional view showing an electrode structure of a semiconductor light emitting device according to a first embodiment of the present invention.

FIG. 2 is a sectional view showing the structure of a semiconductor light emitting device according to a first embodiment of the present invention, which device is formed by crystal growth into an approximately hexagonal pyramid shape having tilt crystal planes, wherein electrodes are formed on halfway areas of the tilt crystal planes. As shown in the figure, electrodes 10 for efficient emergence of light emitted by an input current to the outside of the device are formed, and a current block layer 11 is formed on the electrodes 10, upper sides from the electrodes 10, and the vertex of the device. The halfway areas, on which the electrodes 10 are formed, of the tilt crystal planes have good crystallinity. The current block layer 11 is formed on the tilt crystal planes except for the vicinity of the bottom surface, the electrodes 10, and the region in the vicinity of the vertex of the device. The current block layer 11 functions to suppress injection of a current to the vertex portion of the crystal layer.

Figure 3:
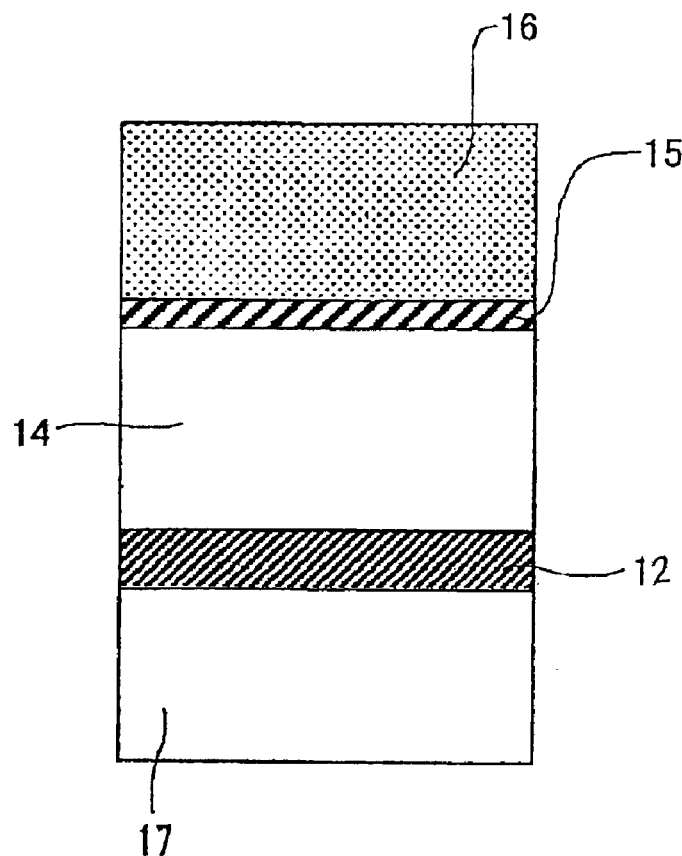
FIG. 3 is a partial sectional view showing the electrode structure of the semiconductor light emitting device according to the first embodiment of the present invention.

The structure of the electrode will be described with reference to FIG. 3. A second cladding layer, which is a second conductive type semiconductor layer 14 forming the tilt crystal planes, is a p-type GaN layer doped with magnesiun, and a first conductive type semiconductor layer 17 provides a first cladding layer. A contact metal layer 15 having a thickness equal to or less than a penetration depth of light emitted by an active layer 12 formed on the crystal layer is formed on the GaN layer. After the formation of the contact metal layer 15 having the specified thickness, an electrode layer 16 is formed on the contact metal layer 15. Since the thickness of the contact metal layer 15 is equal to or less than the penetration depth of light emitted by the active layer 12, the contact metal layer can increase the reflectance of the electrode layer 16 while ensuring good ohmic contact between the electrode layer 16 and the tilt crystal planes. This is effective to increase the intensity of light reflected from the electrode layer 16 to the light transmission type substrate side. Since the electrode layer is formed on the second conductive type semiconductor layer, light traveling to the second conductive type semiconductor layer side is reflected from the electrode layer onto the substrate side, and since the thickness of the contact metal layer 15 is as thin as being equal to or less than the penetration depth of light emitted by the active layer 12, the contact metal layer 15 can increase the reflectance of the electrode layer 16 while ensuring good ohmic contact between the electrode layer 16 and the tilt crystal planes. As a result, it is possible to enhance the luminous efficiency as a whole.

The electrode structure will be more fully described below. The electrode 10 has a multi-layer structure formed by stacking the electrode layer 16 on the contact metal layer 15. To be more specific, on the outermost surface of the cladding layer composed of the p-type GaN layer as the second conductive type semiconductor layer 14, a nickel layer as the contact metal layer 15 allowing ohmic contact between the p-side electrode layer 16 and the GaN layer as the second conductive type semiconductor layer 14 is formed as a first layer of the electrode 10. The thickness of the contact metal layer 15 made from nickel is set to be equal to or less than the penetration depth of light emitted by the active layer, and according to this embodiment, it is set to about 10 nm. The p-side electrode layer 16 is formed on the contact metal layer 15 made from nickel. The p-side electrode layer 16 is represented by a thin film made from, for example, aluminum or silver. Light passing through the contact metal layer 15 made from nickel is reflected from the interface of the p-side electrode layer 16. Although the p-side electrode layer 16 is represented by the thin film made from, for example, aluminum or silver, the present invention is not limited thereto but may be configured such that a metal layer made from gold or platinum be stacked on the thin film made from, for example, aluminum or silver. The thickness of each of the contact metal layer 15 and the electrode layer 16 according to this embodiment may be changed depending on the characteristic of light emitted by the active layer.

The contact metal layer 15 and the electrode layer 16 can be each formed by a vapor-deposition process or a plating process. At this time, the thickness or the like thereof can be changed as needed. When light as electromagnetic waves having energy is reflected from a metal surface, the light permeates in the metal surface by a length called "penetration depth". Such penetrating light is called "evanescent waves". The light component having an energy corresponding to the complex refractive index and the incident angle of the metal is absorbed in the metal in the form of the evanescent waves, and the light component having the remaining energy is reflected outwardly from the metal. On the other hand, even if the thickness of the contact metal layer 15 is significantly thin, the contact metal layer 15 sufficiently allows ohmic contact between the electrode layer 16 to the GaN layer 14, and according to this embodiment, the thickness of the contact metal layer 15 made from nickel is set to be equal to or less than the penetration depth of light emitted by the active layer 12. As a result, it is possible to enhance the reflecting efficiency of the electrode 10.

The current block layer 11 is formed on the tilt crystal planes so as to cover the electrodes 10, the region from the upper ends of the electrodes 10 to the vertex portion containing the vertex of the device, and the vicinity of the bottom surface. The current block layer 11 functions to suppress injection of a current into a poor crystalline region. The current block layer 11 is formed by forming an insulating film made from $SiO_2$ or the like, and removing a portion, corresponding to the vicinity of the bottom surface, of the insulating film by etching. The current block layer 11 is not necessarily formed by an insulating material but may be made from a material which forms a potential barrier against the surface of a crystal layer forming the second cladding layer as the second conductive type semiconductor layer 14 and which is less subjected to injection of a current. For example, the current block layer 11 may be configured as a thin film made from a metal material reflecting light such as Ag or Al. In the case of using a material reflecting light, a light reflection film can be formed on a region in which a current is not injected, with a result that the light emergence efficiency can be enhanced as compared with the case of reflecting light only by the electrodes 10.

[Embodiment 2]

Figure 4:
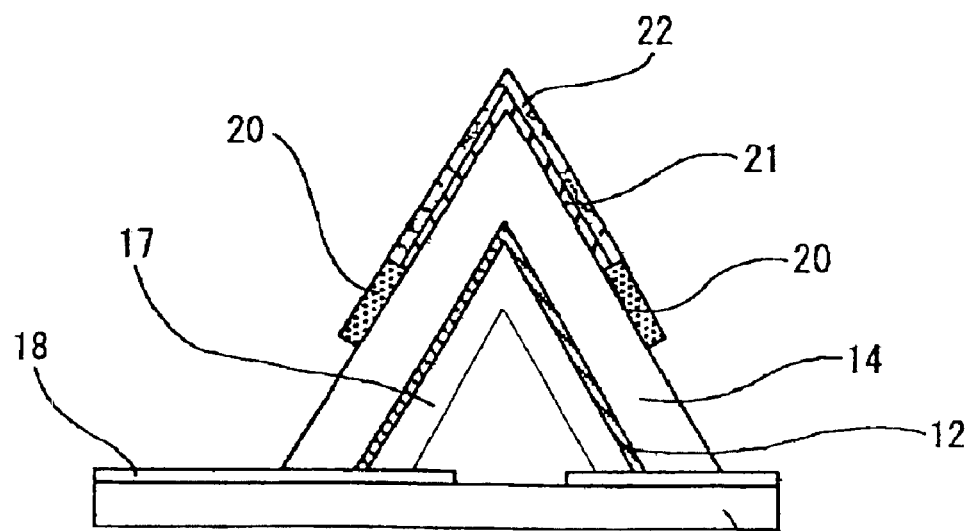
FIG. 4 is a sectional view showing an electrode structure of a semiconductor light emitting device according to a second embodiment of the present invention.

FIG. 4 is a sectional view showing the structure of a semiconductor light emitting device according to a second embodiment of the present invention, which device is formed by crystal growth into an approximately hexagonal pyramid shape having tilt crystal planes, wherein electrodes are formed on halfway areas of the tilt crystal planes. As shown in the figure, electrodes 20 for efficient emergence of light emitted by an input current to the outside of the device are formed, and a current block layer is formed on the electrodes 20, the upper sides of the electrodes 20, and the region in the vicinity of the vertex of the device. The current block layer has a multi-layer structure formed by stacking a metal thin film layer 22 on an insulating layer 21.

The electrode 20 is formed by forming a contact metal layer 15 having a thickness equal to or less than a penetration depth of light emitted by an active layer 12 formed on a crystal layer under the electrode 20, and forming an electrode layer 16 on the contact metal layer 15 having the specific thickness. Since the thickness of the contact metal layer 15 is as thin as being equal to or less than the penetration depth of light emitted by the active layer 12, the contact metal layer 15 can increase the reflectance of the electrode layer 16 while allowing good ohmic contact between the electrode layer 16 and the crystal layer. This is effective to increase the intensity of light reflected from the electrode layer 16 to the light transmission type substrate side. Since the electrode layer 16 is formed on the second conductive type semiconductor layer 14, light traveling to the second conductive type semiconductor layer 14 side is reflected to the substrate side. In addition, since the contact metal layer 15 is formed between the electrode layer 16 and the second conductive type semiconductor layer 14, it is possible to enhance the luminous efficiency as a whole.

The contact metal layer 15 allowing ohmic contact between the p-side electrode 20 and the second conductive type semiconductor layer 14 composed of the GaN layer is made from nickel. The thickness of the contact metal layer 15 made from nickel is set to be equal to or less than the penetration depth of light emitted by the active layer, and according to this embodiment, it is set to about 10 nm. The electrode layer 16 is formed on the contact metal layer 15 made from nickel. The electrode layer 16 is represented by a thin film made from, for example, aluminum or silver. Light passing through the contact metal layer 15 made from nickel is reflected from the interface of the electrode layer 16. Although the electrode layer 16 is represented by the thin film made from, for example, aluminum or silver, the present invention is not limited thereto but may be configured such that a metal layer made from gold or platinum be stacked on the thin film made from, for example, aluminum or silver. The thickness of each of the contact metal layer 15 and the electrode layer 16 according to this embodiment may be changed depending on the characteristic of light emitted by the active layer.

The current block layer is formed on the tilt crystal planes so as to cover the p-side electrodes 20, the upper sides of the p-side electrodes 20, and the region in the vicinity of the vertex of the device. The current block layer, which is composed of the stack of the insulating layer 21 and the metal thin film layer 22, functions to efficiently reflect light emitted by the active layer 12, and hence to enhance the light emergence efficiency. At this time, since the insulating layer 21 is formed as the first layer, any current is little injected in a poor crystalline region. As a result, it is possible to inject a current only in a good crystalline region under the electrodes 20. The insulating layer 21 may be made from an insulating material having light permeability. For example, the insulating layer 21 may be configured as a film-like layer made from a transparent insulating material such as $SiO_2$. The metal thin film layer 22 formed on the insulating layer 21 may be configured as a film-like layer made from a metal having a high reflectance such as Ag or Al.

[Embodiment 3]

Figure 5:
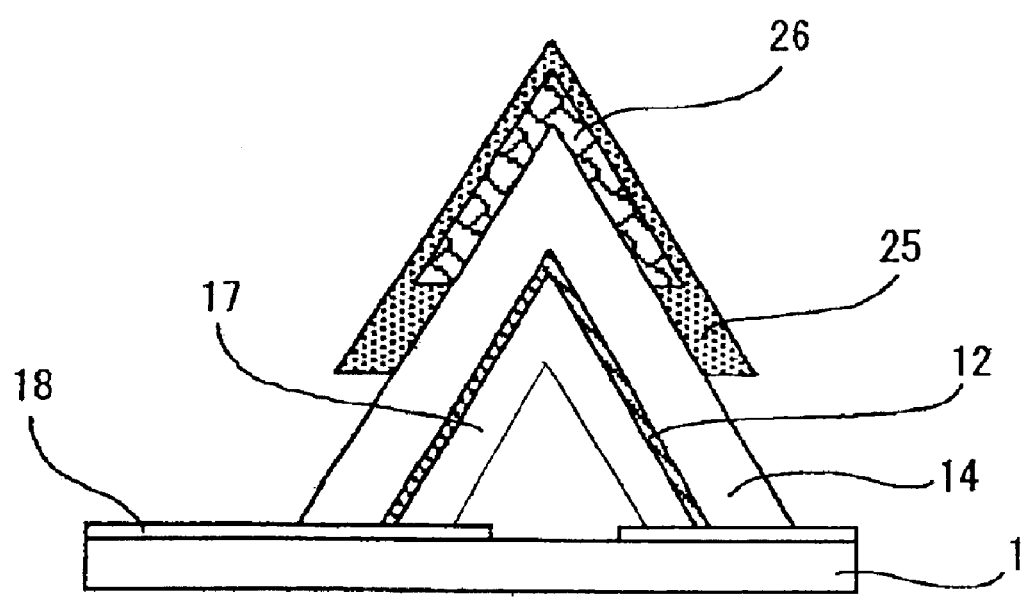
FIG. 5 is a partial sectional view showing an electrode structure of a semiconductor light emitting device according to a third embodiment of the present invention.

FIG. 5 is a sectional view showing the structure of a third embodiment, wherein electrodes are formed on halfway areas of tilt, crystal planes of an approximately hexagonal pyramid shape formed by crystal growth. As shown in the figure, electrodes for efficient emergence of light emitted by an input current to the outside of the device are formed, and a current block layer having a multi-layer structure of an insulating layer and a metal thin film is formed to cover a region, corresponding to the upper halves of the electrodes, of the tilt crystal planes and to cover the region in the vicinity of the vertex of the device.

After an insulating layer 26 is formed in the vicinity of the vertex of the device, p-side electrodes 25 are formed on the insulating layer 26. In this case, the p-side electrodes 25 are formed not only to cover the insulating layer 26 but also to cover a region, on the lower side from the insulating layer 26, of the tilt crystal planes. The p-side electrodes 25 are thus formed on the good crystalline halfway areas of the tilt crystal planes. The previously formed insulating layer 26 functions as a current block layer for suppressing injection of a current in a poor crystalline region in the vicinity of the vertex of the device. Accordingly, since only a good crystalline region in which the p-side electrodes 25 are directly coupled to a second cladding layer 14 can be used as a light emitting region, it is possible to enhance the luminous efficiency of light emitted by an input current.

The lower end of the insulating layer 26 on each tilt crystal plane is located nearly at a boundary between a good crystalline region of the tilt crystal plane and a poor crystalline region which is close to the vertex of the device and which has a stepped surface and is thereby poorer in crystallinity than the halfway area of the tilt crystal plane. The lower end of the p-side electrode 25 on each tilt crystal plane is located nearly at a boundary between a good crystalline region of the tilt crystal plane and a poor crystalline region which is close to the bottom surface of the device and which has a stepped surface and is thereby poorer in crystallinity than the halfway area of the tilt crystal plane. The lower end of the insulating layer 26, that is, the upper end of the region in which the p-side electrode 25 is coupled with the second cladding layer 14, and the lower end of the p-side electrode 25 are set to positions where light emitted by the active layer 12 is efficiently, totally reflected from a plane portion, at which the lower half of the p-side electrode 25 is not formed, of the tilt crystal plane.

The insulating layer 26 may be made from an insulating material having light permeability, for example, a transparent insulating material such as $SiO_2$. The p-side electrode 25 is composed of a contact metal layer 15 and an electrode layer 16. The contact metal layer 15 made from nickel, which is adapted to allow ohmic contact between the electrode layer 16 and the GaN layer 14 is formed as a first layer. The thickness of the contact metal layer 15 made from nickel is set to be equal to or less than a penetration depth of light emitted by the active layer, and according to this embodiment, it is set to about 10 nm. The p-side electrode is represented by a thin film made from aluminum or silver. Light passing through the nickel layer as the contact metal layer 15 is reflected by the interface of the electrode layer 16. Although the electrode layer 16 is represented by the thin film made from aluminum or silver, the present invention is not limited thereto but may be configured such that the a metal layer made from gold or platinum be stacked on the thin film made from aluminum or silver. In addition, the material of the contact metal layer 15 is not limited to nickel but may be Pd, Co, Sb, or an alloy thereof. Since the p-side electrode 25 is formed on the insulating layer 26 having light permeability, a light component of light emitted by the active layer 12, which passes through the insulating layer 26 and reaches the p-side electrode 25 on the insulating layer 26 can be efficiently reflected from the electrode layer 26, to enhance the light emergence efficiency. In this embodiment, the electrodes 25 are formed on the halfway areas of the tilt crystal planes of an approximately hexagonal pyramid shape; however, the present invention can be applied to a light emitting device having a shape different from an approximately hexagonal pyramid shape insofar as it has tilt crystal planes. Even in this case, the luminous efficiency of the light emitting device can be enhanced by forming the electrodes 25 on halfway areas of the tilt crystal planes of the device. For example, the present invention can be applied to a light emitting device having an approximately hexagonal truncated pyramid shape.

The present invention can be applied to a semiconductor laser other than a light emitting diode and another semiconductor light emitting device. The emission wavelength of the semiconductor light emitting device of the present invention is not particularly limited; however, in the case of a device allowing emission of blue light, the p-side electrode layer 16 may be made from Ag or Al.

[Embodiment 4]

An image display system or an illuminating system according to the present invention will be described below, wherein each system includes an array of a plurality of semiconductor light emitting devices each of which has an electrode formed on halfway areas of tilt crystal planes of an approximately hexagonal pyramid shape. According to this image display system and illuminating system, since the semiconductor light emitting devices each of which exhibits a high light emergence efficiency of light emitted by an input current, which are described in each of the first, second, and third embodiments, are arrayed so as to be scannable, it is possible to suppress electrode areas by using the S-planes, and hence to reduce the total area of light emitting portions and improve the current-light conversion efficiency. In this embodiment, description will be made of a method of fabricating an image display system including an array of semiconductor light emitting devices each of which has the electrode structure described in the third embodiment.

Figure 6A:
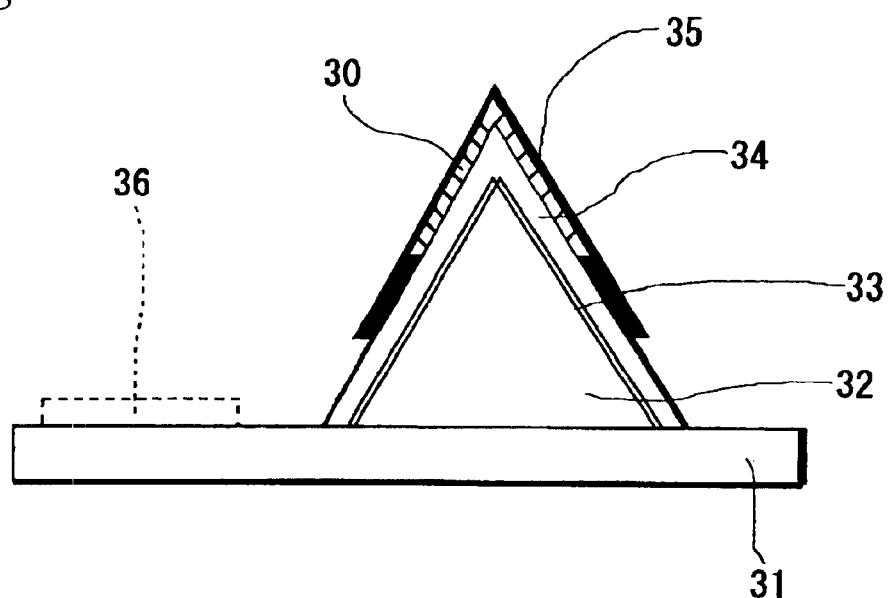
FIGS. 6A and 6B are a sectional view and a plan view showing the structure of a semiconductor light emitting device in a process of fabricating an image display system according to a fourth embodiment of the present invention, respectively.
Figure 6B:
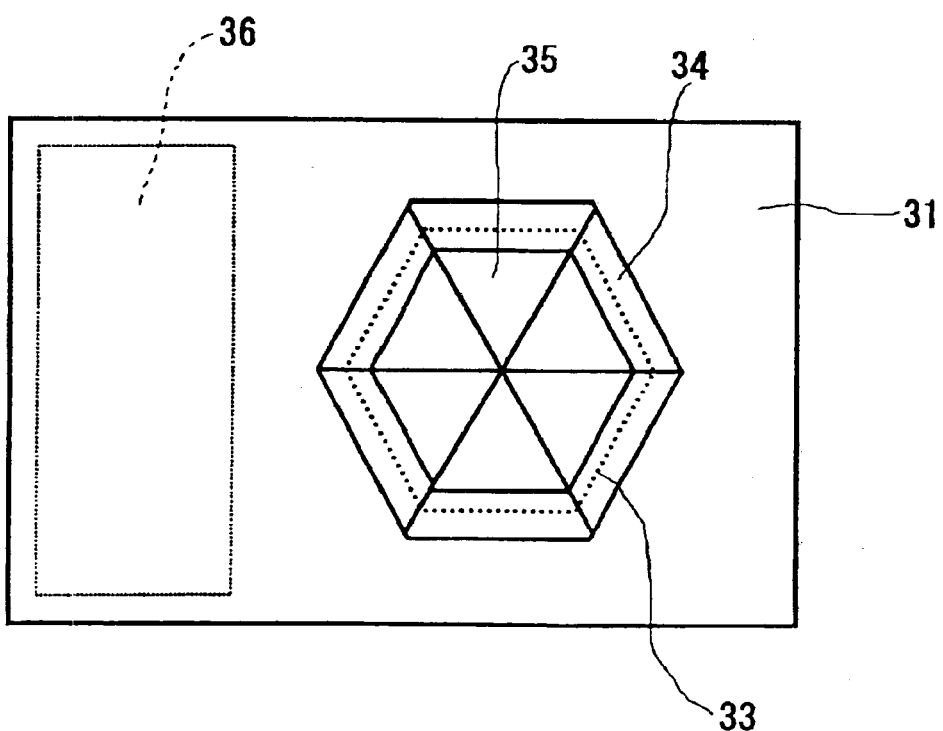

The structure of the light emitting device will be first described. FIGS. 6A and 6B are a sectional view and a plan view of the device, respectively. A hexagonal pyramid shaped GaN layer 32 is formed by selective growth on an underlying growth layer 31 composed of a GaN based semiconductor layer. While not shown, an insulating film is formed on the underlying growth layer 31, and the hexagonal pyramid shaped GaN layer 32 is formed by selective growth from an opening portion formed in the insulating film by an MOCVD process or the like. The GaN layer 32 becomes a pyramid shaped growth layer covered with S-planes [(1–101) planes] when the C-plane of sapphire is used as the principal plane of a sapphire substrate at the time of crystal growth. The GaN layer 32 is a region doped with silicon. An InGaN layer 33 as an active layer is formed so as to cover the tilt S-planes of the GaN layer 32, and a GaN layer 34 doped with magnesium is formed on the InGaN layer 33. The GaN layer 34 doped with magnesium functions as a cladding layer.

The light emitting diode is provided with a p-electrode 35 and an n-electrode 36. The p-side electrode 35 is formed by vapor-depositing a metal material such as Ni/Pt/Au or Ni(Pd)/Pt/Au on the GaN layer 34 doped with magnesium. Before the p-electrode 35 is formed, an insulating layer 30 having light permeability is formed in the vicinity of the vertex of the device. The insulating layer 30 can be made from a transparent insulating material such as $SiO_2$. The p-side electrode 35 is formed at a position determined by an angle (2θ–90°) with respect to the bottom surface. Light emitted by the active layer under the p-side electrode 35 is efficiently, totally reflected from the p-side electrode 35 and the tilt crystal planes, to emerge to the outside of the device. The n-electrode 36 is formed in an opening portion formed in the above-described insulating film (not shown) by vapor-depositing a metal material such as Ti/Al/Pt/Au. In this embodiment, if the n-electrode is formed at a portion, apart from the light emergence surface, of the back surface of the underlying growth layer 31, it is not required to form the n-electrode 36 on the front surface of the underlying growth layer 31.

The GaN based light emitting device having such a structure allows emission of even blue light. In particular, such a light emitting device can be relatively simply peeled from the sapphire substrate by laser abrasion. In other words, each device can be selectively peeled by selectively irradiating the device with laser beams. In the light emitting diode according to this embodiment, light emitted by the active layer passes through the GaN layer and emerges out from the bottom side through the underlying growth layer 31, or efficiently, totally reflected from the p-side electrode 35 or the tilt crystal planes, and then passes through the GaN layer 32 and emerges out from the bottom side through the underlying growth layer 31. The GaN based light emitting device may have a structure including the active layer formed into a planar or strip shape, or a pyramid structure including the C-plane formed at the upper end portion of the pyramid. In addition, the GaN light emitting diode may be replaced with any other nitride based light emitting device or a compound semiconductor device.

Figure 7:
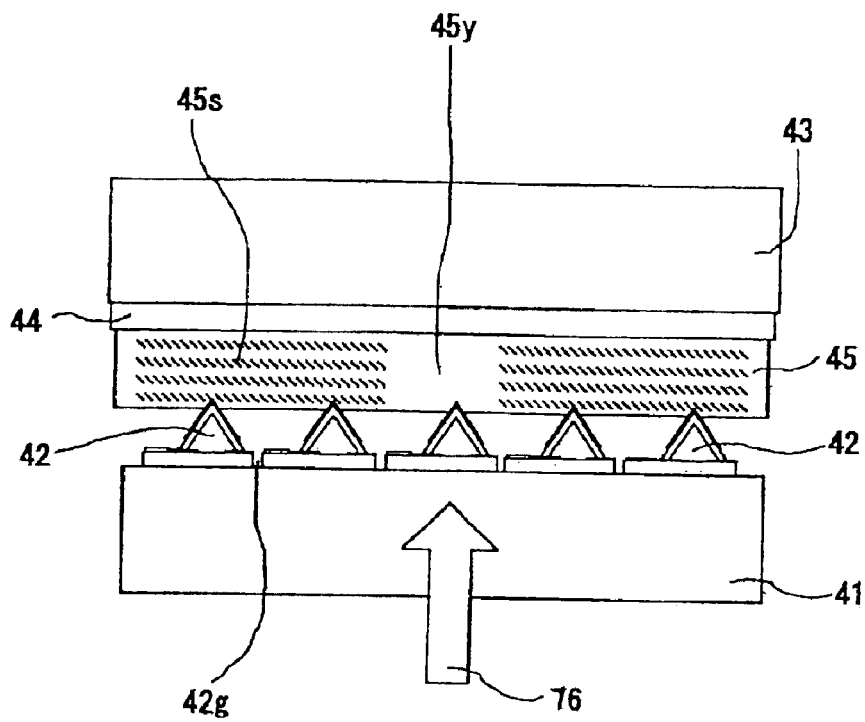
FIG. 7 is a sectional view showing a device transfer step in the process of fabricating the image display system according to the fourth embodiment of the present invention.

The step of peeling light emitting devices from the substrate on which the devices remain as having been formed, and covering each of the devices with a resin layer will be described below. As shown in FIG. 7, a plurality of light emitting diodes 42 are formed in a matrix pattern on the principal plane of a first substrate 41. The size of the light emitting devices 42 is set to about 20 μm. The first substrate 41 is a substrate for growing a crystal layer constituting the light emitting diode 42. The material of the first substrate 41 is not particularly limited insofar as a crystal layer having tilt crystal planes can be formed on the substrate. The first substrate 41 used in this embodiment is a sapphire substrate made from a material having high light permeability against a wavelength of a laser beam used for irradiation of the light emitting diode 42. The first substrate 41 uses the C-plane of sapphire as the principal plane which has been often used for growing a gallium nitride (GaN) based compound semiconductor material. It is to be noted that the term "C-plane" used herein is not limited to the strict C-plane but may include a plane tilted therefrom by an angle ranging from 5 to 6°. The light emitting diode 42 is already provided with a p-electrode and the like but is not subjected to final wiring. Grooves 42g for device isolation are formed so as to individually isolate the light emitting diodes 42 from each other. The grooves 42g are formed, for example, by reactive ion etching. Such a first substrate 41 is opposed to a temporarily holding member 43 for selective transfer of the light emitting diodes 42 therebetween.

Both a peelable layer 44 and an adhesive layer 45 are formed on the surface, opposed to the first substrate 41, of the temporarily holding member 43. Here, a glass substrate or a quartz glass substrate can be used as the temporarily holding member 43. The peelable layer 44 on the temporarily holding member 43 may be made from a material such as a fluorocarbon resin, a silicone resin, a water-soluble adhesive (for example, polyvinyl alcohol: PVA), or polyimide. As one example, a polyimide film as the peelable layer 44 is formed on a quartz glass substrate as the temporarily holding member 43 to a thickness of about 1 μm to 3 μm, and a UV-curing type adhesive layer as the adhesive layer 45 is formed on the peelable layer 44 to a thickness of about 20 μm.

The adhesive layer 45 of the temporarily holding member 43 is adjusted to be divided into cured regions 45s and non-cured regions 45y. The first substrate 41 is aligned to the temporarily holding member 43 in such a manner that each of the light emitting devices 42 to be selectively transferred to the temporarily holding member 43 is positioned at the non-cured region 45y. The adjustment of the adhesive layer 45 such that the adhesive layer 45 is divided into the cured regions 45s and the non-cured regions 45y may be performed by selectively exposing the adhesive layer 45 (made from the UV-curing type adhesive) with a pitch of 200 μm, thereby forming the cured regions 45s and the non-cured regions 45y (to which the light emitting devices 42 are to be transferred) arranged with a pitch of 200 μm. After such alignment, the light emitting diode 42 to be transferred is peeled from the first substrate 41 by making use of laser abrasion. Since the GaN based light emitting diode 42 is decomposed into Ga (metal) and nitrogen at the interface with sapphire, it can be easily peeled from the first substrate 41. The laser beam 76 used herein may be an excimer laser beam or a harmonic YAG laser beam.

The light emitting diode 42, which has been selectively irradiated with laser beams, is peeled from the first substrate 41 at the boundary between the GaN layer and the first substrate 41 by laser abrasion, and is transferred to the opposed temporarily holding member 43 in such a manner that the p-electrode of the light emitting diode 42 is pierced in the adhesive layer 45 of the temporarily holding member 43. The other light emitting diodes 42, which are not irradiated with laser beams and are positioned at the cured regions 45s of the adhesive layer 45, are not transferred to the temporarily holding member 43 side. In the example shown in FIG. 7, only one light emitting diode 42 is selectively irradiated with laser beams; however, in actual, the light emitting diodes 42 spaced from each other with a pitch "n" are irradiated with laser beams. With such selective transfer, the light emitting diodes 42 are re-arrayed on the temporarily holding member 43 with a pitch larger than the array pitch of the light emitting diodes 42 on the first substrate 41.

Figure 8:
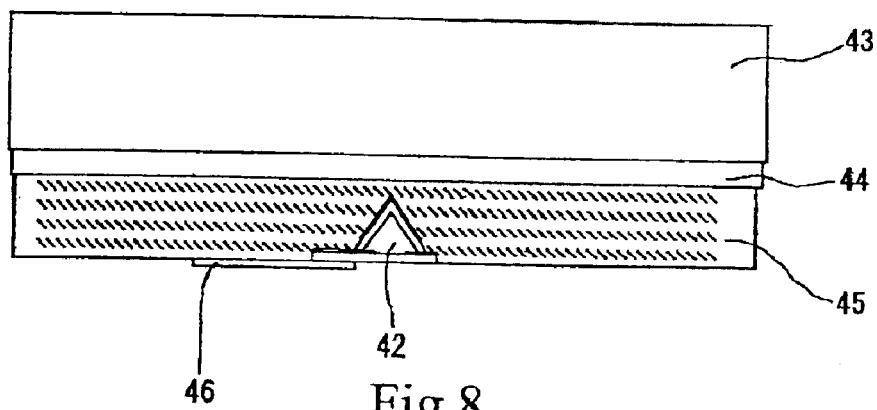
FIG. 8 is a sectional view of a device holding state after transfer of devices in the process of fabricating the image display system according to the fourth embodiment of the present invention.

The light emitting diode 42 is held by the adhesive layer 45 of the temporarily holding member 43 with the back surface of the light emitting diode 42 taken as the n-electrode (cathode electrode) side, and since the resin (adhesive) is removed from the back surface of the light emitting diode 42 by cleaning, an electrode pad 46 can be formed on the back surface of the light emitting diode 42 as shown in FIG. 8 in such a manner as to be electrically connected thereto.

As one example of cleaning of the adhesive layer 45, the resin (adhesive) of the adhesive layer 45 is etched with oxygen plasma and then cleaned by irradiation of UV ozone. In addition, when the GaN based light emitting diode is peeled from the first substrate 41 made from sapphire by laser abrasion, Ga is deposited on the peeled plane. Accordingly, such an element Ga must be etched with a NaOH containing water solution or dilute nitric acid. After that, the electrode pad 46 is patterned. At this time, the electrode pad on the cathode side can be formed into a size of about 60 μm square. As the electrode pad 46, there can be used a transparent electrode (ITO or ZnO based electrode) or an electrode made from a material such as Al/Cu. In the case of using a transparent electrode, even if the electrode largely covers the back surface of the light emitting diode, it does not shield light emission. As a result, a patterning accuracy of the electrode can be roughened and the size of the electrode can be made large. This is advantageous in facilitating the patterning process.

The step of transferring each light emitting diode 42 from the first temporarily holding member 43 to a second temporarily holding member 47 will be described below. A peelable layer 48, a light emitting diode 42 to be transferred, and a peelable layer 48 are formed on the second temporarily member 47 to which the light emitting diode 42 is to be transferred. The peelable layer 48 can be made from a resin having light permeability such as a fluorocarbon resin, a silicone resin, a water-soluble adhesive (for example, PVA), or polyimide. As one example, a glass substrate is used as the second temporarily holding member 47.

The temporarily holding member 43 is opposed to the temporarily holding member 47 provided with the peelable layer 48 in such a manner that the adhesive layer 45 is brought into close-contact with the peelable layer 48. In such a state, to separate the peelable layer 44 from the temporarily holding member 43, the temporarily holding member 43 is irradiated with excimer laser beams from the side, opposed to the surface provided with the peelable layer 44, of the temporarily holding member 43. At this time, the temporarily holding member 43 is irradiated with excimer laser beams from the back surface, opposed to the surface provided with the peelable layer 44, of the temporarily holding member 43. Since the temporarily holding member 43 is made from glass, the excimer laser beams is little absorbed in the temporarily holding member 43, to irradiate the vicinity of the interface between the peelable layer 44 and the temporarily holding member 43, thereby causing laser abrasion thereat. As a result, the adhesive force between the peelable layer 44 and the temporarily holding member 43 is lowered, and thereby only the temporarily holding member 43 is separated from the device structure including each light emitting diode 42 and the peelable layer 44 as the uppermost layer. Each light emitting diode 42 is thus transferred to the second temporarily holding member 47 side.

At this time, since the peelable layer 44 have a sufficient film thickness, it absorbs all of the excimer laser beams having passed through the temporarily holding member 44. Accordingly, the excimer laser beams do not reach the layers under the peelable layer 44. In other words, the adhesive layer 45 and the peelable layer 48 are not deteriorated by the excimer laser beams.

Figure 9:
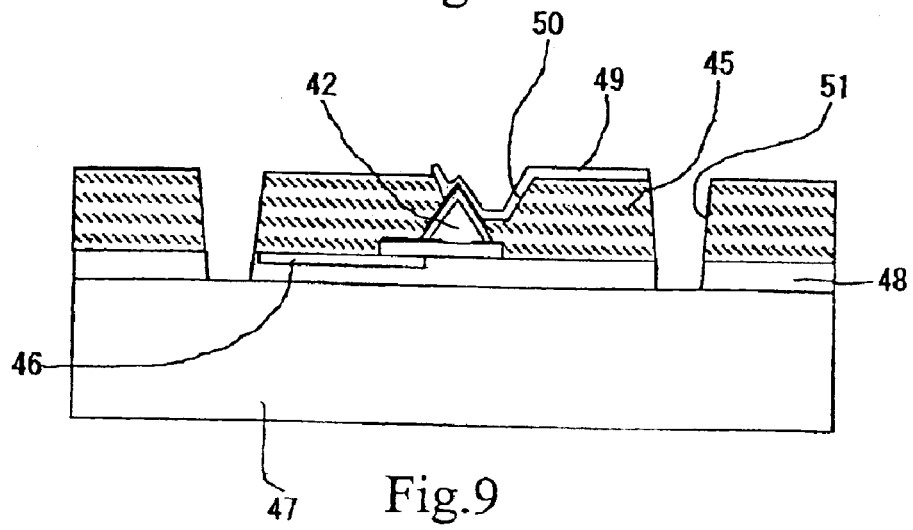
FIG. 9 is a sectional view showing a resin-molded device forming step in the process of fabricating the image display system according to the fourth embodiment of the present invention.

FIG. 9 shows a dicing state of the adhesive layer 45. After the light emitting diode 42 is transferred from the temporarily holding member 43 to the second temporarily holding member 47, a via-hole 50 on the anode electrode (p-electrode) side is formed and an anode side electrode pad 49 is formed. Thereafter, the adhesive layer 45 made from the resin is diced. As a result of dicing, device isolation grooves 51 are formed, to isolate each light emitting diode 42 from those adjacent thereto, whereby each resin-molded device having a specific shape is formed. The resin-molded device is in the state being adhesively bonded on the temporarily holding member 47. To isolate the light emitting diodes 42 arrayed in a matrix from each other, the device isolation grooves 51 have a planar pattern composed of a plurality of parallel lines extending in the vertical and horizontal directions. The bottom of the device isolation groove 51 faces to the surface of the second temporarily holding member 47.

The step of forming the anode side electrode pad 49 of each light emitting diode 42 and then forming the device isolation grooves 51 will be more fully described below. In one example of such a process, the surface of the second temporarily holding member 47 is etched with oxygen plasma until the surface of the light emitting diode 42 is exposed. The via-hole 50 is formed by using excimer laser beams, harmonic YAG laser beams, or carbon dioxide laser beams. At this time, the diameter of the via-hole is set to about 3 to 7 $\mu$m. The anode side electrode is made from Ni/Pt/Au. The dicing process may be performed by using a general blade, and if a narrow cut-in width of 20 $\mu$m or less is required, the dicing process may be performed by laser cutting. As the laser beams used for cutting, there may be used excimer laser beams, harmonic YAG laser beams, or carbon dioxide laser beams. The cut-in width is dependent on the size of the light emitting diode covered with the adhesive layer 45 made from the resin to be located in a pixel of an image display unit. As one example, grooves each having a width of about 40 $\mu$m are formed by excimer laser beams, to divide the device structure into the individual devices, thereby forming the resin-molded devices each having a specific shape.

Figure 10:
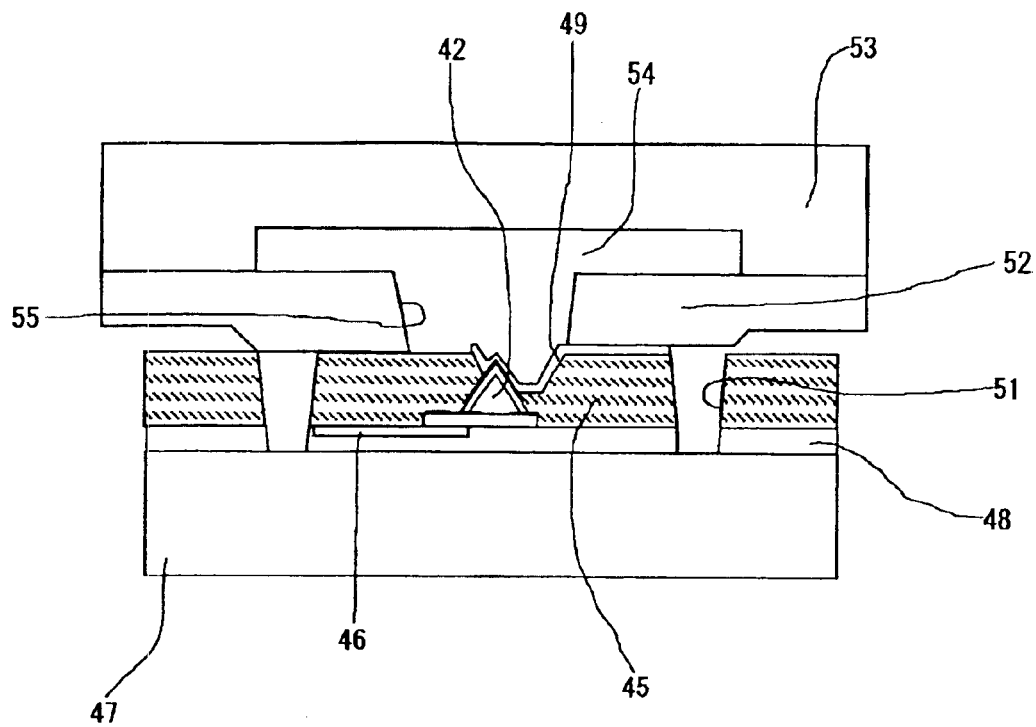
FIG. 10 is a sectional view showing a step of aligning a resin-molded device to an attracting hole in the process of fabricating the image display system according to the fourth embodiment of the present invention.

The step of peeling each resin-molded device containing the light emitting device 42 from the second temporarily holding member 47 and simultaneously forming irregularities on the peelable layer 48 will be described below. First, as shown in FIG. 10, the resin-molded device is peeled from the second temporarily holding member 47 and is then aligned to an attraction hole 55 for transfer. In actual, a number of the attraction holes 55 arrayed in a matrix with a pitch corresponding to a pixel pitch of an image display unit are formed in order to collectively attract a number of the resin-molded devices. To be more specific, the attraction holes 55, each having an opening diameter of about 100 $\mu$m, are arranged with a pitch of 600 $\mu$m in order to collectively attract the resin-molded devices of the number of about 300 pieces. The attraction holes 55 may be formed by preparing a metal plate 52 made from Ni by electrocasting or a stainless steel and forming holes in the metal plate 52 by etching.

The vicinity of the interface between each resin-molded device aligned to the corresponding attraction hole 55 and the second temporarily holding member 47 is irradiated with energy beams. The energy beams are emitted from the side, opposed to the surface on which the resin-molded device remains as adhesively bonded, of the second temporarily holding member 47. Since the second temporarily holding member 47 is made from glass having light permeability, the energy beams are little absorbed in the second temporarily holding member 47. As a result, the peelable layer 48, located in the vicinity of the interface of the holding member 47, of the resin-molded device is irradiated with the energy beams. The peelable layer 48 irradiated with the energy beams loses the adhesive force for adhesively bonding the temporarily holding member 47 by laser abrasion. According to this embodiment, excimer laser beams are used as the energy beams; however, other laser beams such as YAG laser beams may be used as the energy beams.

In the state that the adhesive force between the resin-molded device and the holding member 47 is lowered, the pressure of an attracting chamber 54 communicated to the attraction hole 55 is controlled to a negative pressure, to allow attraction of the light emitting diode 42 in the form of the resin-molded device. The light emitting diode 42 in the form of the resin-molded device is thus peeled from the second temporarily holding member 47 by using a mechanical means.

Figure 11:
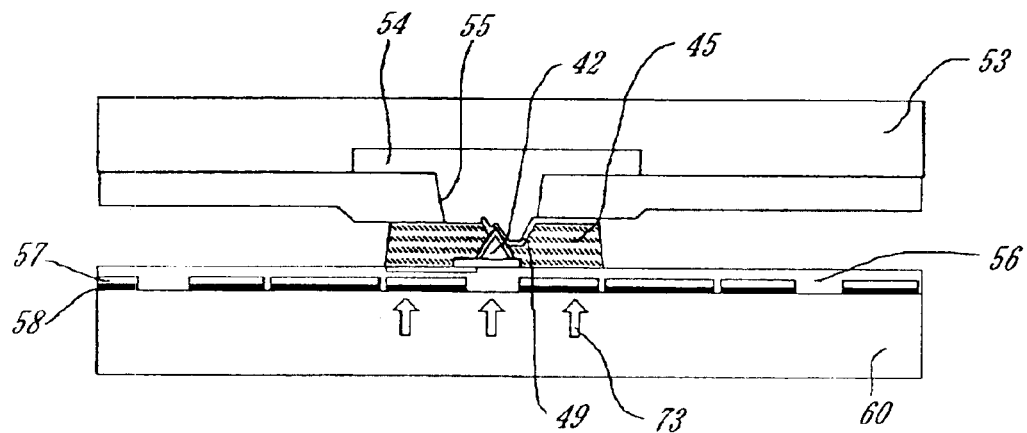
FIG. 11 is a sectional view showing a step of fixing a resin-molded device to a system substrate in the process of fabricating the image display system according to the fourth embodiment of the present invention.

FIG. 11 is a view showing the transfer of each resin-molded device to a second substrate 60 which is part of an image display system. The second substrate is made from a material having light permeability such as glass. At the time of mounting each resin-molded device to the second substrate 60, an adhesive layer 56 is previously formed on the second substrate 60. A region, to which each light emitting diode 42 in the form of the resin-molded device is mounted, of the adhesive layer 56 is cured, so that each light emitting diode 42 is fixedly arrayed on the second substrate 60. At the mounting of each light emitting diode 42, the pressure of the attracting chuck 54 of an attracting device 53 is controlled to a positive pressure in order to apply a force to the resin-molded device in the direction where the resin-molded device is removed from the attraction hole 55. In other words, at this time, the attraction state between the attracting device 53 and the light emitting device 42 is released. The adhesive layer 56 is made from a thermosetting adhesive or a thermoplastic adhesive. The light emitting diodes 42 in the form of the resin-molded diodes are arrayed on the second substrate 60 in such a manner as to be spaced from each other with a pitch larger than each of the pitch of the diodes on the temporarily holding member 43 and the pitch of the diodes on the temporarily holding member 47. It is to be noted that the energy beams (laser beams 73) for curing the resin of the adhesive layer 56 is supplied from the back surface of the second substrate 60.

Only a portion, corresponding to the resin-molded device (light emitting diode 42 and the adhesive layer 45) to be transferred, of the adhesive layer 56 is irradiated with the laser beams 73 from the back surface of the second substrate 60, to be thus heated. With such heating of the adhesive layer 56, if the adhesive layer 56 is made from a thermoplastic resin, the heated portion of the adhesive layer 56 is softened, to be cooled and cured, whereby the resin-molded chip being in contact with the cured portion of the adhesive layer 56 is fixed to the second substrate 60. Similarly, if the adhesive layer 56 is made from a thermosetting adhesive, only a portion, irradiated with the laser beams 73, of the adhesive layer 56 is cured, whereby the resin-molded chip being in contact with the cured portion of the adhesive layer 56 is fixed to the second substrate 60.

An electrode layer 57, which also functions as a shadow mask, is disposed on the second substrate 60. The electrode layer 57 may be irradiated with the laser beams 73, to be heated, thereby indirectly heating the adhesive layer 56. In particular, a black chromium layer 58 may be formed on the surface, on the screen side, that is, the viewer side, of the electrode layer 57. This is advantageous in improving the contrast of an image, and further increasing the energy absorption rate of the black chromium layer 58, thereby efficiently heating the adhesive layer 56 by selectively irradiating the black chromium layer 58 with the laser beams 73.

Figure 12:
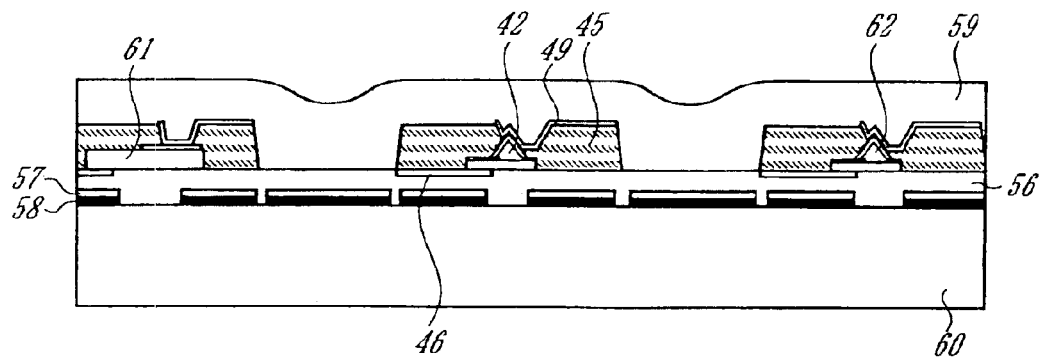
FIG. 12 is a sectional view showing a step of arraying resin-molded devices on the system substrate in the process of fabricating the image display system according to the fourth embodiment of the present invention.

FIG. 12 is a view showing a state that the resin-molded devices containing the light emitting diodes denoted by references 42, 61, and 62 are arrayed on the second substrate 60 and are covered with an insulating layer 59. The resin-molded devices 42, 61 and 62 can be mounted at desired positions by using the attracting device 53 shown in FIG. 10 or 11. In this case, the process of mounting each of the resin-molded devices 42, 61 and 62 may be performed in the same manner as that described above except that the position, at which the corresponding device 42, 61 or 62 is to be mounted, of the second substrate 60 is suitably shifted. The insulating layer 59 may be made from a transparent epoxy adhesive, a UV-curing type adhesive, or polyimide.

Figure 13:
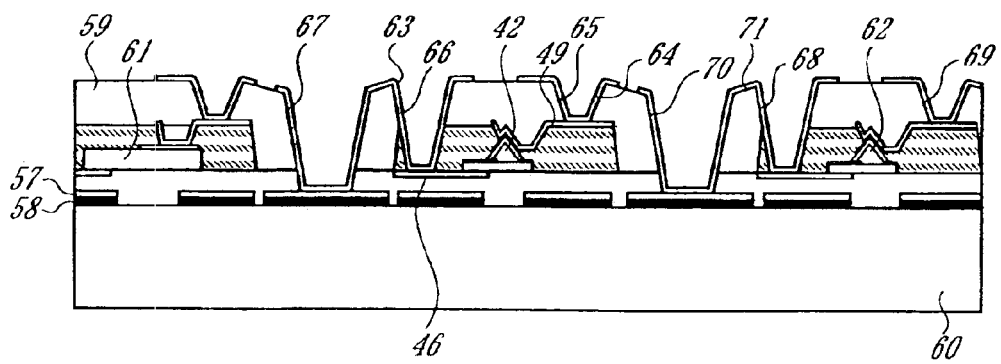
FIG. 13 is a sectional view showing a wiring formation step in the process of fabricating the image display system according to the fourth embodiment of the present invention.

FIG. 13 is a view showing a wiring step for forming opening portions 65, 66, 67, 68, 69, and 70 in the insulating layer 59, and also forming wiring lines 63, 64, and 71 for connecting the anode and cathode electrode pads of the light emitting diodes 42, 61, and 62 to the electrode layer 57 (wiring electrode) formed on the second substrate 60. Since the areas of the electrode pads 46 and 49 of each of the light emitting diodes 42, 61 and 62 are large, the shapes of the opening portions, that is, the via-holes can be made large, with a result that the positioning accuracy of each via-hole may be rough as compared with a via-hole directly formed in each light emitting diode. To be more specific, when each of the electrode pads 46 and 49 having a size of about 60 $\mu$m square is provided, the via-hole having a diameter of about 20 $\mu$m can be formed. Since the via-holes are of three kinds connected to the wiring substrate, the anode electrode, and the cathode electrode, the depth of each via-hole may be optimized by controlling the pulse number of laser beams depending on the kind of the via-hole. A protective layer is then formed on the wiring lines, to accomplish a panel of an image display system. The protective layer may be made from the same transparent epoxy adhesive as that used for the insulating layer. The protective layer is cured by heating, to perfectly cover the wiring lines. After that, a driver IC is connected to the wiring at the end portion of the panel, to fabricate a drive panel. An image display system capable of creating a high quality image, which includes an array of the devices each exhibiting a high light emergence efficiency by a current inputted in the device, can be accomplished by the above-described production steps.

INDUSTRIAL APPLICABILITY

As described above, according to the semiconductor light emitting device and a fabrication method thereof according to the present invention, it is possible to provide a semiconductor light emitting device capable of exhibiting both a high light emergence efficiency and a high luminous efficiency. According to the image display system and the illuminating system, each of which includes an array of the semiconductor light emitting devices of the present invention, and fabrication methods thereof according to the present invention, it is possible to provide an image display system capable of reducing the density of a current injected to each device and also displaying a high quality image, and also to provide an illuminating system capable of increasing brightness. In particular, the image display system and illuminating system, each of which includes the array of a large number of light emitting devices, are advantageous in reducing power consumption.

What is claimed is:

1. A semiconductor light emitting device comprising:
   a crystal layer comprising:
   a first conductive type layer,
   an active layer, and
   a second conductive type layer formed on a crystal growth layer;
   said crystal layer having a tilt crystal plane tilted from a principal plane of a substrate; and
   an electrode formed on only a partial area of the tilt crystal plane;
   wherein said electrode is formed in a region on the tilt crystal plane, the region being surrounded by a first plane extending in parallel to the principal plane of said substrate, and a second plane extending in parallel to the principal plane of said substrate;
   wherein an angle formed between the principal plane of said substrate and the tilt crystal plane is taken as $\theta$, a first ridge line of said tilt crystal plane from the principal plane of said substrate by an angle of $\theta$, the first plane containing a first point on the first ridge line of said tilt crystal plane, the second plane containing a second point on the first ridge line of said tilt crystal plane, the first point on the first ridge line is defined by a point at which a first straight line tilted from a bottom side of an opposing tilt crystal plane by an angle of $2\theta-90°$ intersects the first ridge line, the second point on the first ridge line is defined by a point at which a second straight line tilted from the first plane by an angle of $2\theta-90°$ intersects the first ridge line, said opposing tilt crystal plane forming an angle of $\theta$ with the principal plane of said substrate, a second ridge line of said opposing tilt crystal plane tilted from the principal plane of said substrate by an angle of $\theta$, the first straight line starting from an intersection between the bottom side of said opposing tilt crystal plane and the second ridge line, and the second straight line starting from an intersection between the first plane and the second ridge line.

2. A semiconductor light emitting device according to claim 1, wherein said electrode is a p-side electrode.

3. A semiconductor light emitting device according to claim 1, wherein an insulating layer is formed on the tilt crystal plane.

4. A semiconductor light emitting device according to claim 3, wherein said insulating layer is formed in the vicinity of a vertex of said semiconductor light emitting device.

5. A semiconductor light emitting device according to claim 4, wherein said vertex of said semiconductor light emitting device is surrounded by said insulating layer.

6. A semiconductor light emitting device according to claim 3, wherein said insulating layer is formed in the vicinity of the bottom surface of said semiconductor light emitting device.

7. A semiconductor light emitting device according to claim 1, wherein said crystal growth layer has a wurtzite type crystal structure.

8. A semiconductor light emitting device according to claim 1, wherein said crystal growth layer is made from a nitride semiconductor.

9. A semiconductor light emitting device according to claim 1, wherein said crystal layer is provided by selective growth on said substrate via an underlying growth layer.

10. A semiconductor light emitting device according to claim 9, wherein said selective growth is performed by making use of selective removal of said underlying growth layer.

11. A semiconductor light emitting device according to claim 9, wherein said selective growth is performed by making use of an opening portion selectively formed in a mask layer.

12. A semiconductor light emitting device according to claim 11 wherein said crystal layer is formed by selective growth from said opening portion formed in said mask layer in such a manner as to be spread from said opening portion in a lateral direction.

13. A semiconductor light emitting device according to claim 1, wherein the principal plane of said substrate is approximately a C-plane.

14. A semiconductor light emitting device according to claim 1, wherein the tilt crystal plane contains at least one of an S-plane and an (11–22) plane.

15. A semiconductor light emitting device according to claim 1, wherein a current from the electrode is mainly injected into the tilt crystal plane.

16. A semiconductor light emitting device according to claim 1, wherein said active layer is made from InGaN.

17. A semiconductor light emitting device according to claim 1, wherein said tilt crystal plane is configured as six tilt crystal planes nearly symmetrically disposed.

18. A semiconductor light emitting device according to claim 1, wherein said crystal layer has a flat plane comprising a C-plane at an approximately center portion on a side of said crystal layer, said side being opposed to the principal plane of said substrate.

19. An image display system comprising an array of semiconductor light emitting devices for emitting light in response to signals, said semiconductor light emitting devices being each formed by forming a crystal layer having a tilt crystal plane tilted from a principal plane of a substrate on said substrate, and forming a first conductive type layer, an active layer, and a second conductive type layer on said crystal layer in such a manner that said first conductive type layer, said active layer, and said second conductive type layer extend within planes parallel to the tilt crystal plane, wherein an electrode is formed on only a partial area of the tilt crystal plane;

wherein said electrode is formed in a region on the tilt crystal plane, the region being surrounded by a first plane extending in parallel to the principal plane of said substrate, and a second plane extending in parallel to the principal plane of said substrate;

wherein an angle formed between the principal plane of said substrate and the tilt crystal plane is taken as θ, a first ridge line of said tilt crystal plane tilted from the principal plane of said substrate by an angle of θ, the first plane containing a first point on the first ridge, line of said tilt crystal plane, the second plane containing a second point on the first ridge line of said tilt crystal plane, the first point on the first ridge line is defined by a point at which a first straight line tilted from a bottom side of an opposing tilt crystal plane by an angle of 2θ–90° intersects the first ridge line, the second point on the first ridge line is defined by a point at which a second straight line tilted from the first plane by an angle of 2θ–90° intersects the first ridge line, said opposing tilt crystal plane forming an angle of θ with the principal plane of said substrate, a second ridge line of said opposing tilt crystal plane tilted from the principal plane of said substrate by an angle of θ, the first straight line starting from an intersection between the bottom side of said opposing tilt crystal plane and the second ridge line, and the second straight line starting from an intersection between the first plane and the second ridge line.

20. An image display system according to claim 19, wherein said electrode is a p-side electrode.

21. An image display system according to claim 19, wherein the partial area does not comprise a vertex of said semiconductor light emitting device, and wherein the partial area is away from a vicinity of a bottom surface of said semiconductor light emitting device.

22. An illuminating system comprising an array of semiconductor light emitting devices for emitting light in response to signals, said semiconductor light emitting devices being each formed by forming a crystal layer having a tilt crystal plane tilted from a principal plane of a substrate on said substrate, and forming a first conductive type layer, an active layer, and a second conductive type layer on said crystal layer in such a manner that said first conductive type layer, said active layer, and said second conductive type layer extend within planes parallel to the tilt crystal plane, wherein an electrode is formed on only a partial area of the tilt crystal plane;

wherein said electrode is formed in a region on the tilt crystal plane, the region being surrounded by a first plane extending in parallel to the principal plane of said substrate, and a second plane extending in parallel to the principal plane of said substrate;

wherein an angle formed between the principal plane of said substrate and the tilt crystal plane is taken as θ, a first ridge line of said tilt crystal plane tilted from the principal plane of said substrate by an angle of θ, the first plane containing a first point on the first ridge line of said tilt crystal plane, the second plane containing a second point on the first ridge line of said tilt crystal plane, the first point on the first ridge line is defined by a point at which a first straight line tilted from a bottom side of an opposing tilt crystal plane by an angle of 2θ–90° intersects the first ridge line, the second point on the first ridge line is defined by a point at which a second straight line tilted from the first plane by an angle of 2θ–90° intersects the first ridge line, said opposing tilt crystal plane forming an angle of θ with the principal plane of said substrate, a second ridge line of said opposing tilt crystal plane tilted from the principal plane of said substrate by an angle of θ, the first straight line starting from an intersection between the bottom side of said opposing tilt crystal plane and the second ridge line, and the second straight line starting from an intersection between the first plane and the second ridge line.

23. An illuminating system according to claims 22, wherein said electrode is a p-side electrode.

24. An illuminating system according to claim 22, wherein the partial area does not comprise a vertex of said semiconductor light emitting device, and wherein the partial area is away from a vicinity of a bottom surface of said semiconductor light emitting device.

25. A semiconductor light emitting device according to claim 1, wherein the partial area does not comprise a vertex of said semiconductor light emitting device, and wherein the partial area is away from a vicinity of a bottom surface of said semiconductor light emitting device.

* * * * *